United States Patent
Lee (10) Patent No.: US 7,317,354 B2
(45) Date of Patent: Jan. 8, 2008

(54) INDUCTOR

(75) Inventor: Sheng-Yuan Lee, Shindian (TW)

(73) Assignee: VIA Technologies, Inc., Taipei (TW)

( * ) Notice: Subject to any disclaimer, the term of this patent is extended or adjusted under 35 U.S.C. 154(b) by 0 days.

(21) Appl. No.: 11/397,641

(22) Filed: Apr. 5, 2006

(65) Prior Publication Data

US 2006/0284719 A1    Dec. 21, 2006

(30) Foreign Application Priority Data

Jun. 16, 2005  (TW) .............................. 94120077 A (51) Int. Cl.
*H01F 5/00*    (2006.01)
(52) U.S. Cl. ...................... 330/200; 336/232
(58) Field of Classification Search ................ 336/200, 336/223, 232
See application file for complete search history.

(56) References Cited

U.S. PATENT DOCUMENTS 5,831,331 A * 11/1998 Lee ............................ 257/659
6,480,086 B1 * 11/2002 Kluge et al. ................ 336/200
2004/0100349 A1 * 5/2004 Mheen et al. ............... 336/223

FOREIGN PATENT DOCUMENTS

| TW | 200428421 | 4/2001 |
| TW | 515118 B | 12/2002 |
| TW | 516049 B | 1/2003 |
| TW | 554354 B | 9/2003 |

* cited by examiner

*Primary Examiner*—Anh Mai
(74) *Attorney, Agent, or Firm*—Birch, Stewart, Kolasch & Birch, LLP (57) ABSTRACT

An inductor for a substrate of a circuit board includes a first electrical conductive layer and a second electrical conductive layer. The second electrical conductive layer is disposed over the first electrical conductive layer and is electrically connected to the first electrical conductive layer. The width or projecting area of the first electrical conductive layer is less than the width or projecting area of the second electrical conductive layer respectively.

20 Claims, 14 Drawing Sheets

INDUCTOR

BACKGROUND OF THE INVENTION

1. Field of Invention

The present invention relates to an inductor, and more particularly to an inductor for a substrate of a circuit board.

2. Related Art

Accompanying to the development of semiconductor device and process, the inductor required in a circuit of voltage control oscillator (VCO) or radio frequency processor (RF processor) can be directly formed in a chip or be formed in a microstructure and integrated with a chip. The circuit of VCO or RF processor is correctly and stably operated with the inductor of desirable inductance and high quality factor. The quality factor is defined as follows:

The quality factor≈(energy stored/energy lost).

Figure 1:
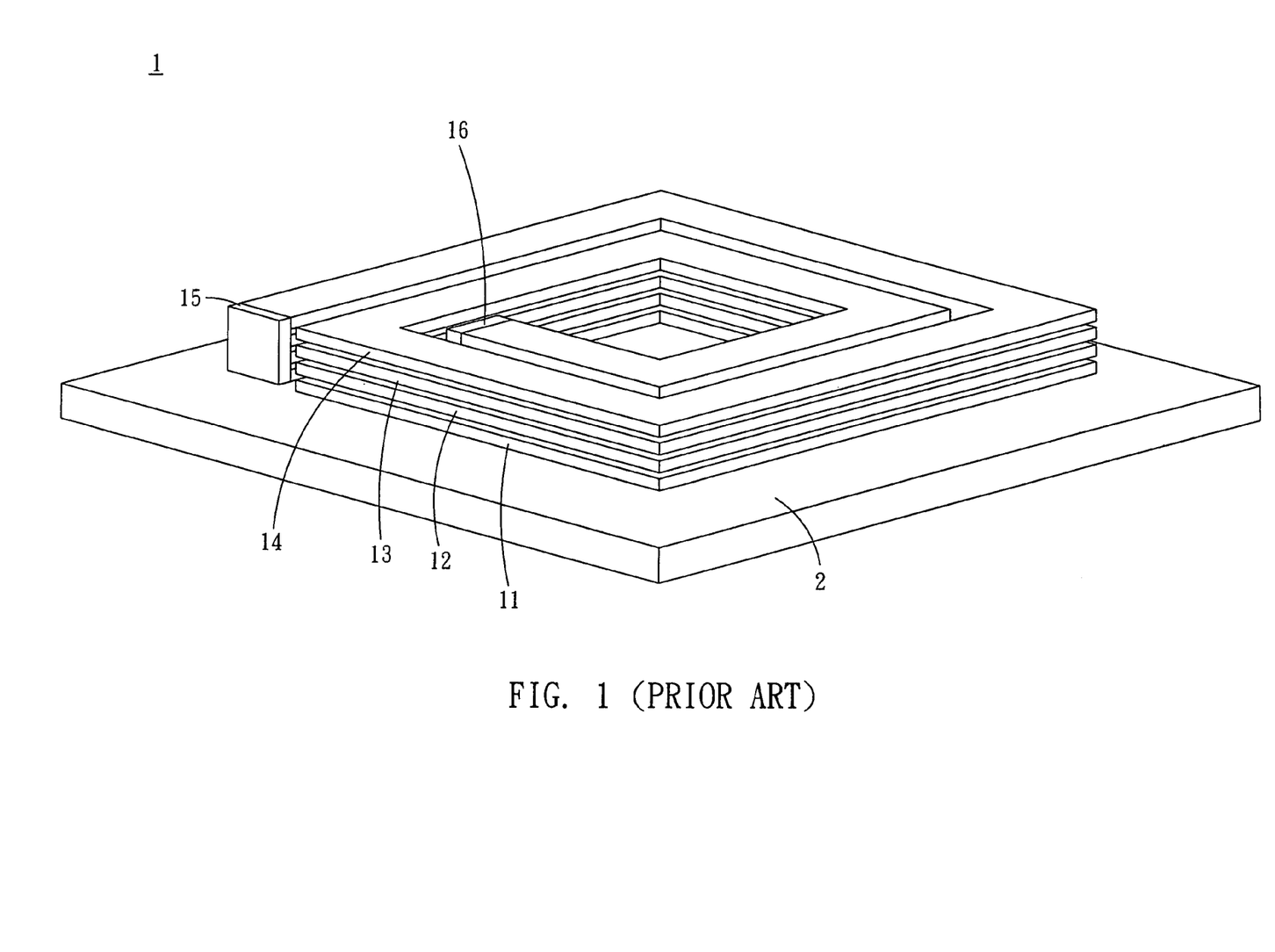
FIG. 1 is a three-dimensional view showing the substrate and the electrical conductive layers of a conventional inductor.
Figure 2:
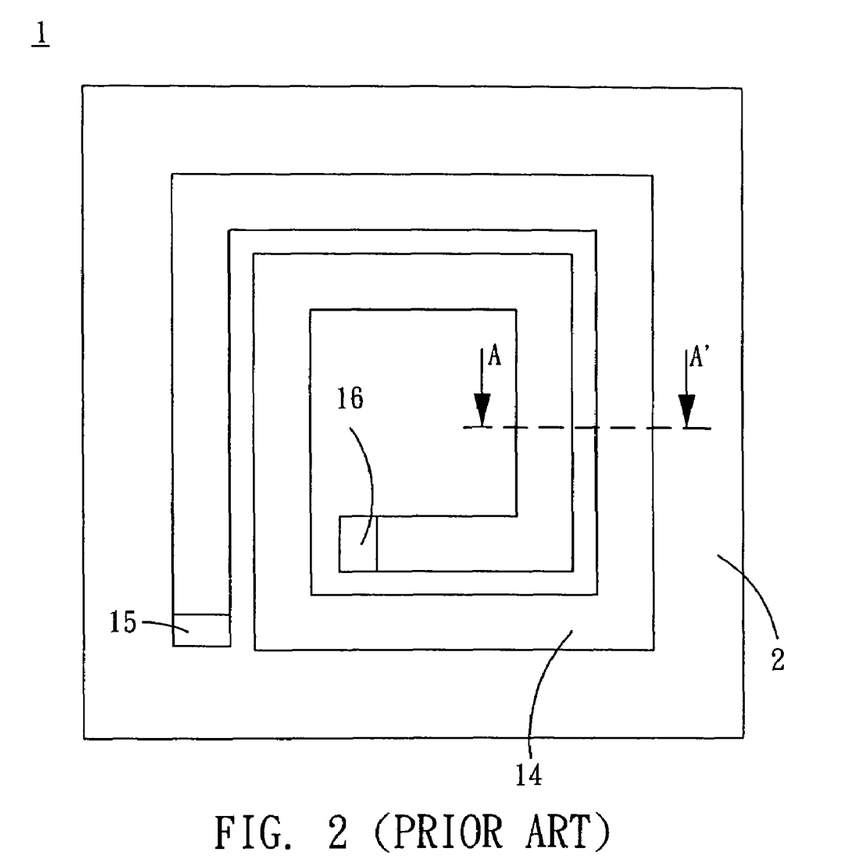
FIG. 2 is a top view showing the conventional inductor in FIG. 1.
Figure 3:
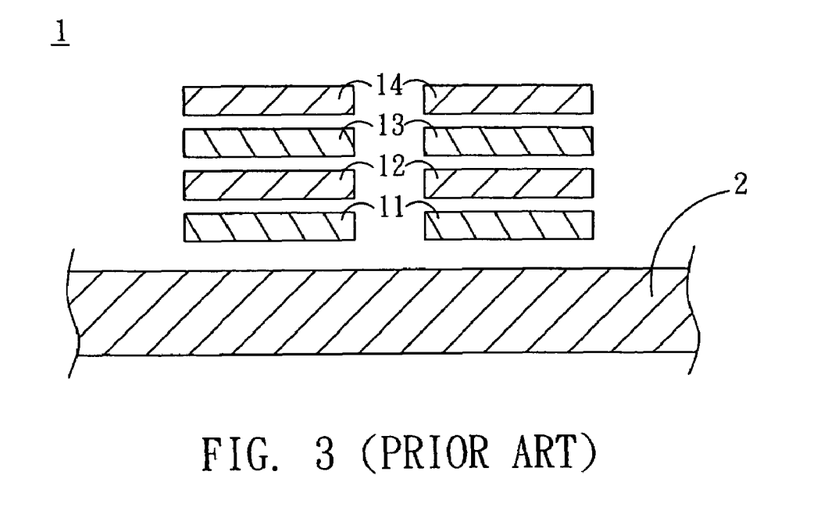
FIG. 3 is a cross-sectional view along A-A' line showing the conventional inductor in FIG. 2.

As shown in FIGS. 1 to 3, a conventional inductor 1 includes a plurality of electrical conductive layers 11-14 disposed over a substrate 2. Between the substrate 2 and the electrical conductive layers 11-14 are isolated by a dielectric material (not shown). The electrical conductive layers 11-14 are electrically connected with each other via a first end 15 of the inductor 1 and the electrical conductive layers 11-14 are electrically connected with each other via a second end 16 of the inductor 1. Two signal terminals (not shown) are respectively connected with the first end 15 and the second end 16.

The inductor 1 is formed to be a multiple spiral structure for increasing an effective cross-sectional area to lower the series resistance, the loss is thus degraded and the quality factor is thus raised. However, the quality factor is influenced by parasitic capacitances between the electrical conductive layers 11-14, parasitic capacitances between the electrical conductive layer 11 and the substrate 2, and eddy current induced in the substrate 2. Thus, the storage capacity of the inductor 1 is lowered under application of high frequency, especially in conductive silicon substrate of an integrated circuit.

It is therefore an important subject of the present invention to provide an inductor with high quality factor to reduce the influence of eddy current of the substrate and parasitic capacitance between the inductor and the substrate on the quality factor, and improve the efficiency and quality.

SUMMARY OF THE INVENTION

In one embodiment according to the present invention, an inductor for a substrate of a circuit board, especially for a substrate of an integrated circuit board, includes a first electrical conductive layer and a second electrical conductive layer. The second electrical conductive layer is disposed over and electrically connected to the first electrical conductive layer. The width or projecting area of the first electrical conductive layer is less than the width or projecting area of the second electrical conductive layer respectively.

In one embodiment according to the present invention, another inductor for a substrate of a circuit board includes a plurality of electrical conductive layers. The electrical conductive layers are sequentially disposed and electrically connected with each other. The width or projecting area of each electrical conductive layer is less than the width or projecting area of the upper electrical conductive layer respectively.

BRIEF DESCRIPTION OF THE DRAWINGS

The present invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 4:
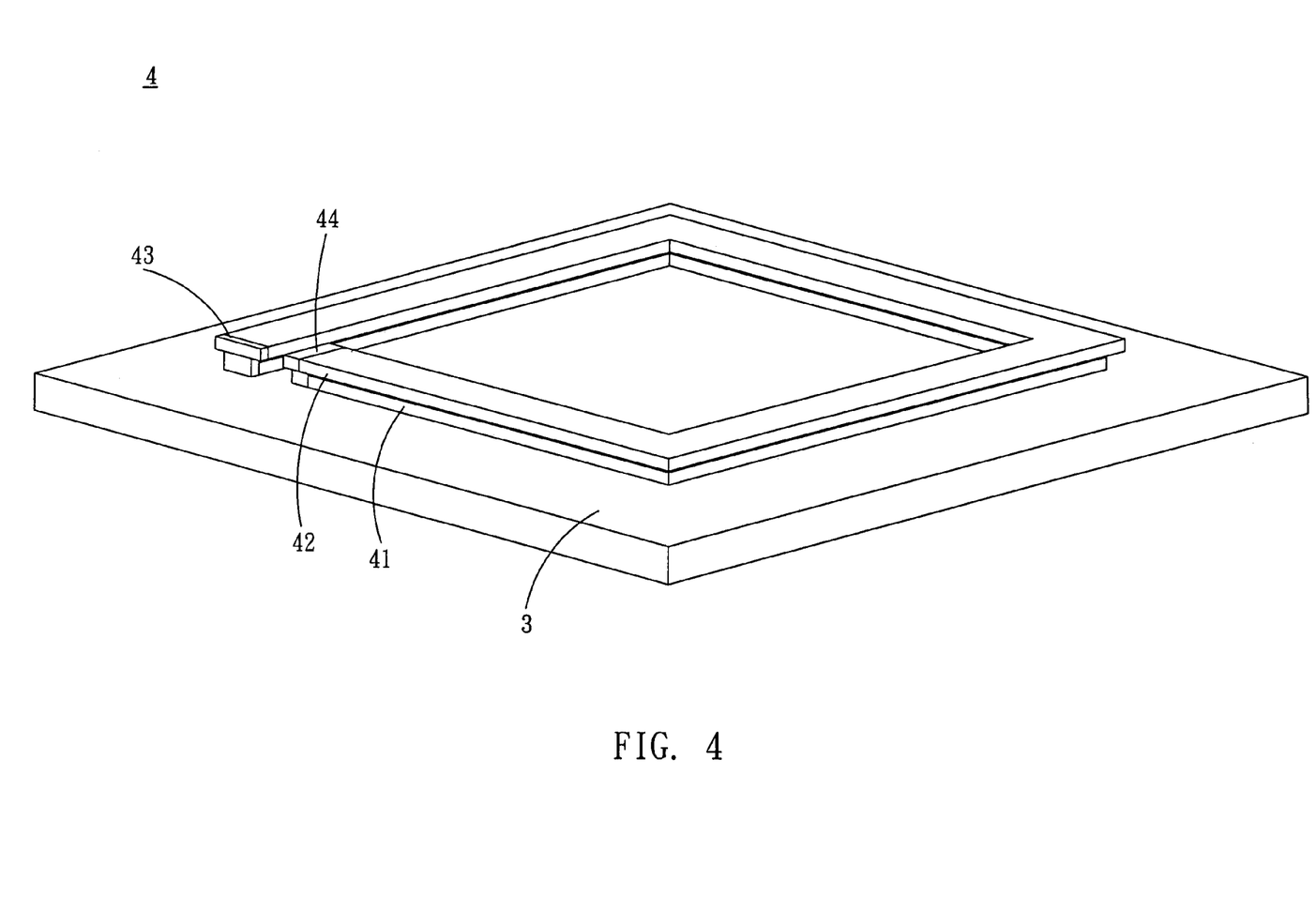
FIG. 4 is a three-dimensional view showing the substrate and the electrical conductive layers of a first embodiment of an inductor according to the present invention.
Figure 6:
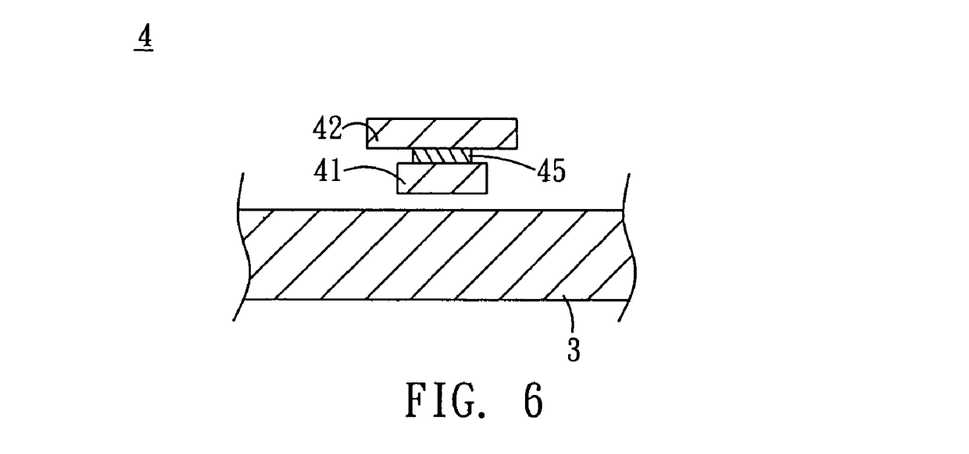
FIG. 6 is a cross-sectional view along B-B' line showing the inductor in FIG. 5.

As shown in FIGS. 4 to 6, a first embodiment of an inductor 4 according to the present invention is disposed over a substrate 3 and includes a first electrical conductive layer 41 and a second electrical conductive layer 42. In FIG. 5A and 5B, the first electrical conductive layer 41 and the second electrical conductive layer 42 are patterned in a spiral fashion to be the traces of the inductor 4. The second electrical conductive layer 42 is disposed over and electrically connected to the first electrical conductive layer 41. The first electrical conductive layer 41 is disposed over the substrate 3. The width or projecting area of the first electrical conductive layer 41 is less than the width or projecting area of the second electrical conductive layer 42 respectively.

For example, the substrate 3 may be a substrate of a circuit board such as a substrate of an integrated circuit (IC) board, a low-temperature cofired ceramic (LTCC) or a printed circuit board (PCB). The first electrical conductive layer 41 or the second electrical conductive layer 42 are made of metal or alloy. Between the substrate 3, the first electrical conductive layer 41 and the second electrical conductive layer 42 are isolated by a dielectric material (not shown). The second electrical conductive layer 42 and the first electrical conductive layer 41 are respectively shown in FIGS. 5A and 5B. The electrical connection between the first electrical conductive layer 41 and the second electrical conductive layer 42 is achieved by a conductor 45, for example a conductive wire, a conductive via or a contact, passing through the dielectric material between of them.

The first electrical conductive layer 41 and the second electrical conductive layer 42 are electrically connected with each other via a first end 43 and a second end 44 of the inductor 4. Two signal terminals (not shown) are respectively connected with the first end 43 and the second end 44.

Figure 5A:
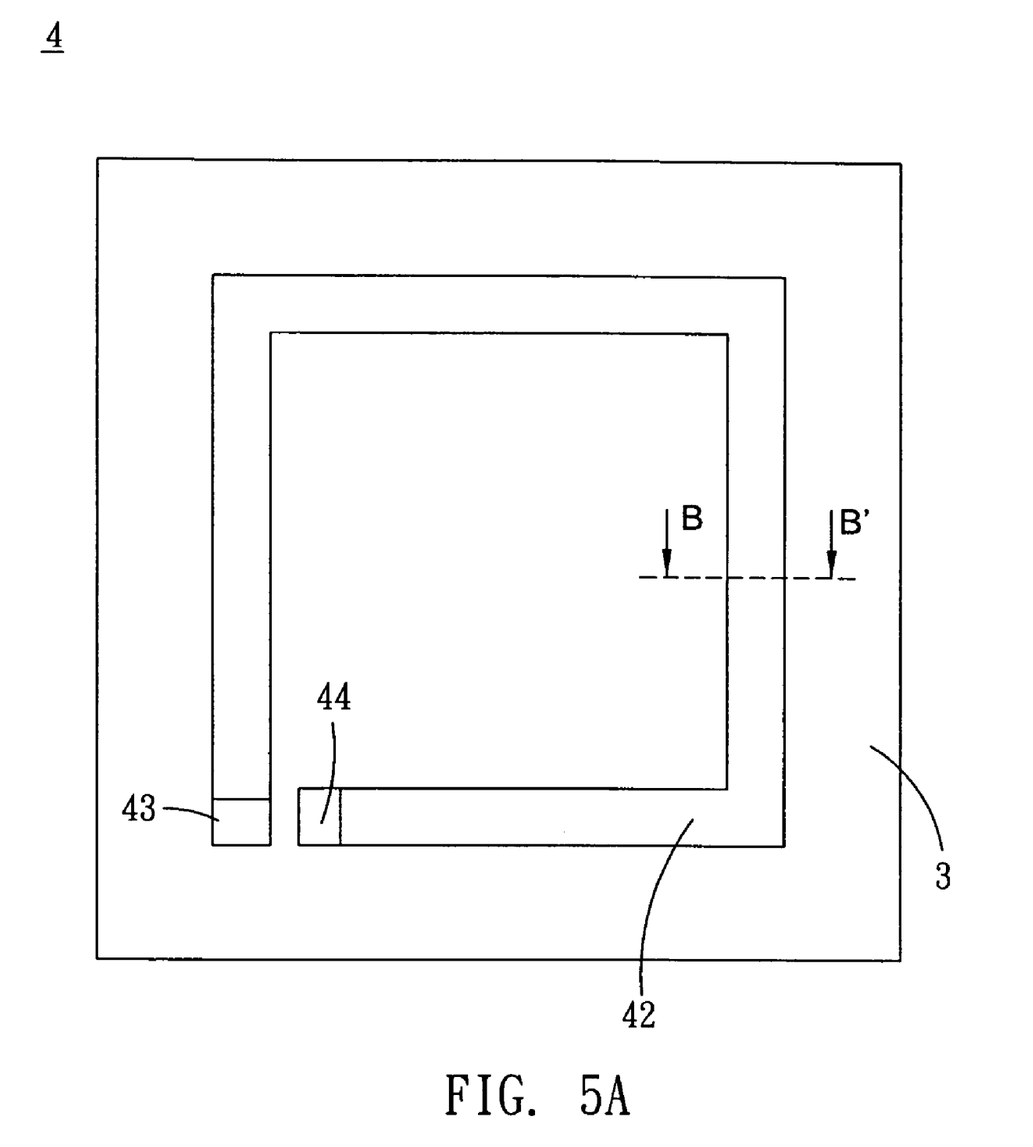
FIGS. 5A to 5D are top views respectively showing the electrical conductive layers and the electrical connections between the electrical conductive layers of the inductor in FIG. 4.
Figure 5B:
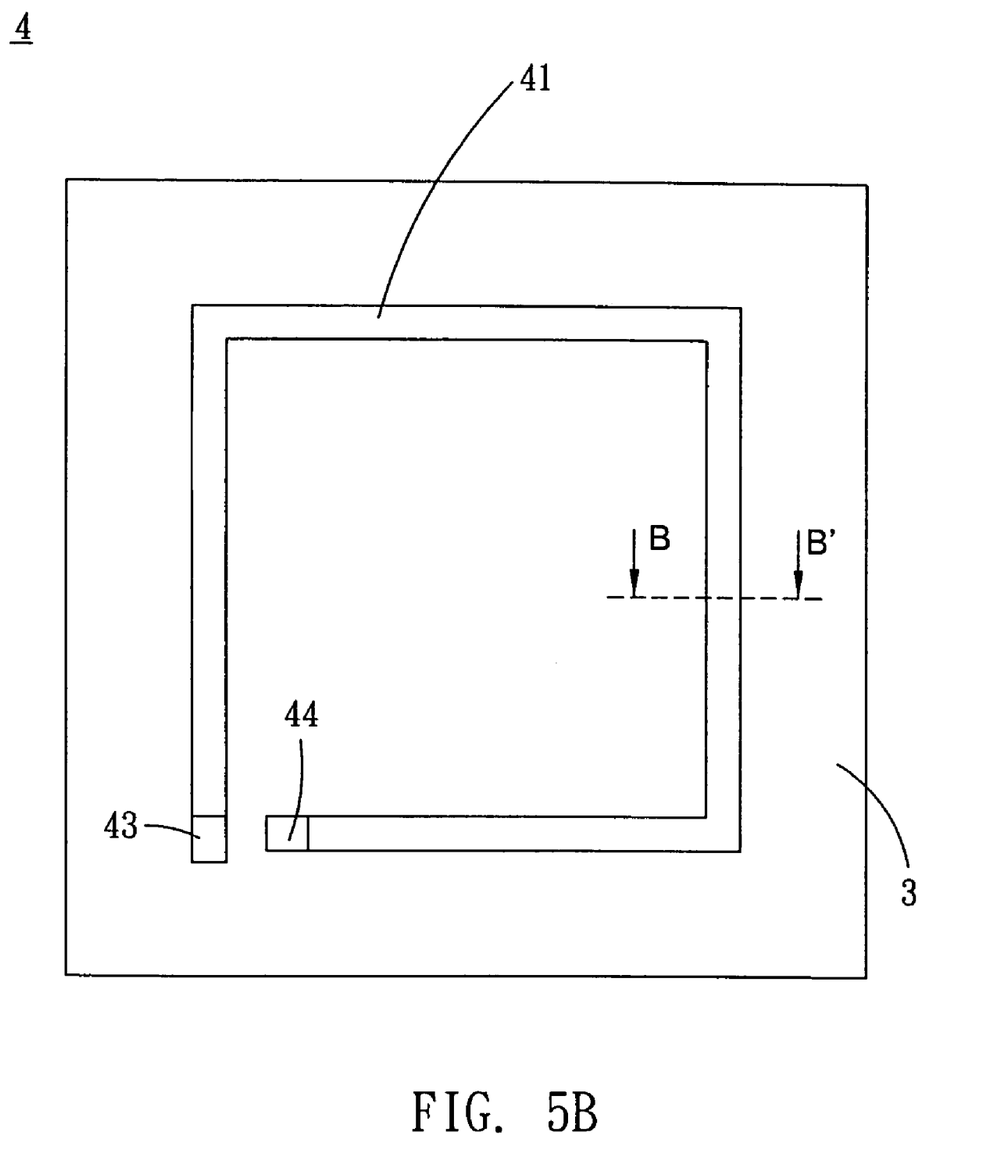
Figure 5C:
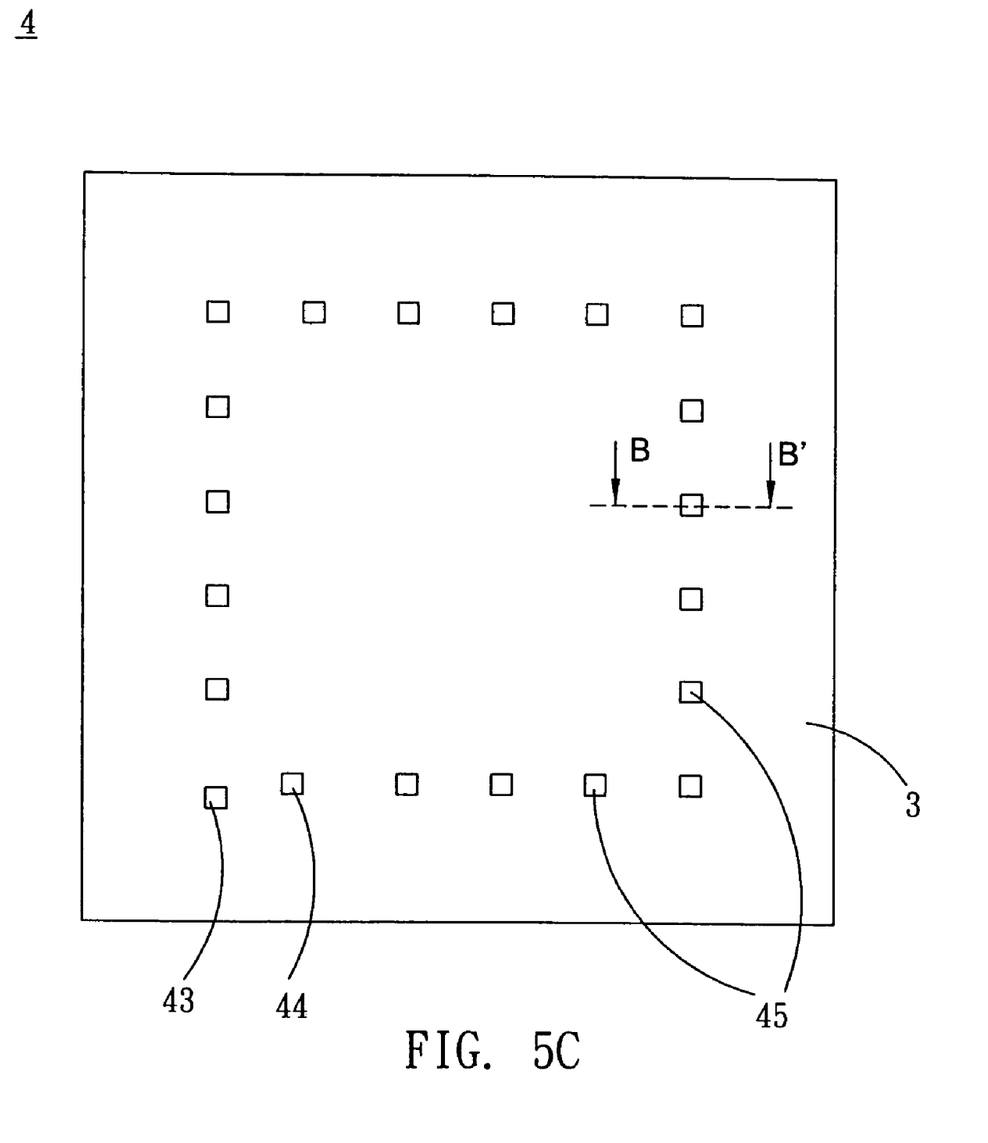
Figure 5D:
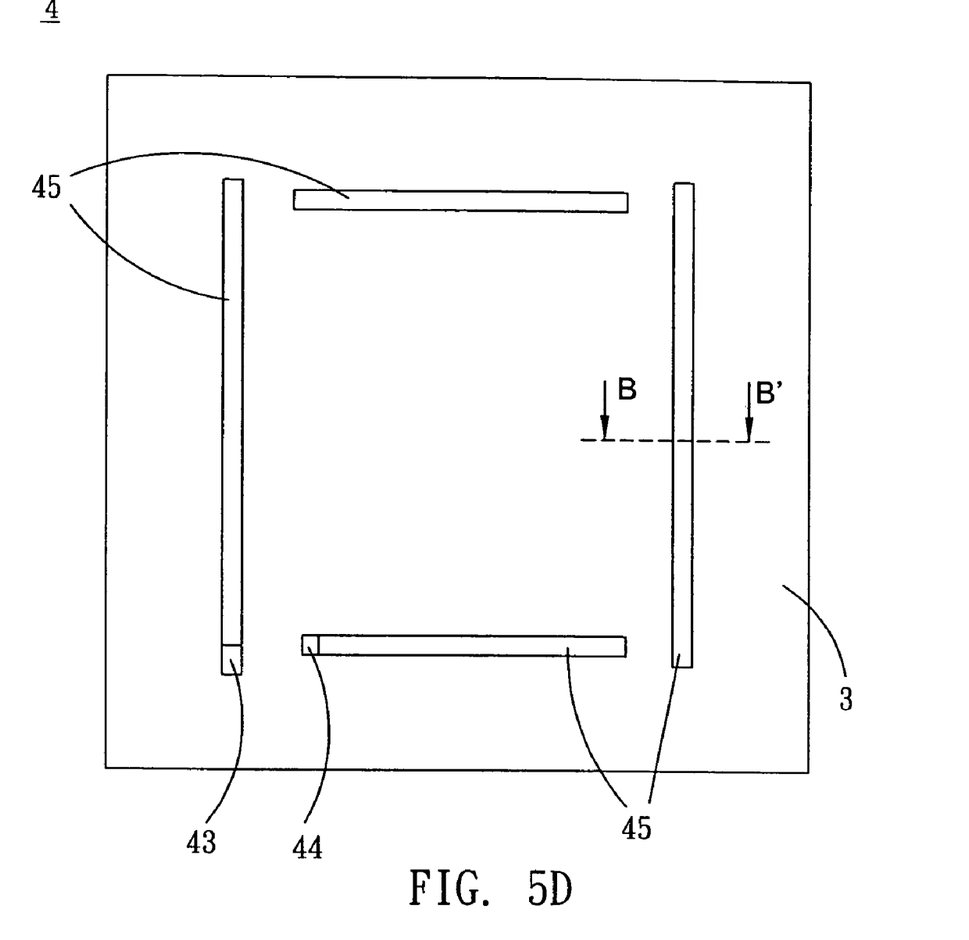

As shown in FIG. 6, the inductor 4 further includes a conductor 45 electrically connected between the first electrical conductive layer 41 and the second electrical conductive layer 42. As shown in FIG. 5C, the conductor 45 may be a plurality of contacts disposed from the first end 43 to the second end 44 and between the first electrical conductive layer 41 and the second electrical conductive layer 42 for electrically connecting the first electrical conductive layer 41 with the second electrical conductive layer 42. Or as shown in FIG. 5D, the conductor 45 may be at least one conductive bar such as a conductive strip disposed between the first electrical conductive layer 41 and the second electrical conductive layer 42 for electrically connecting the first electrical conductive layer 41 with the second electrical conductive layer 42.

The width or projecting area of the first electrical conductive layer 41 may be not larger than eighty percent of the width or projecting area of the second electrical conductive layer 42 respectively when the first electrical conducive layer 41 and the second electrical conducive layer 42 are the adjacent layers within the multi-layered circuit board.

Figure 7:
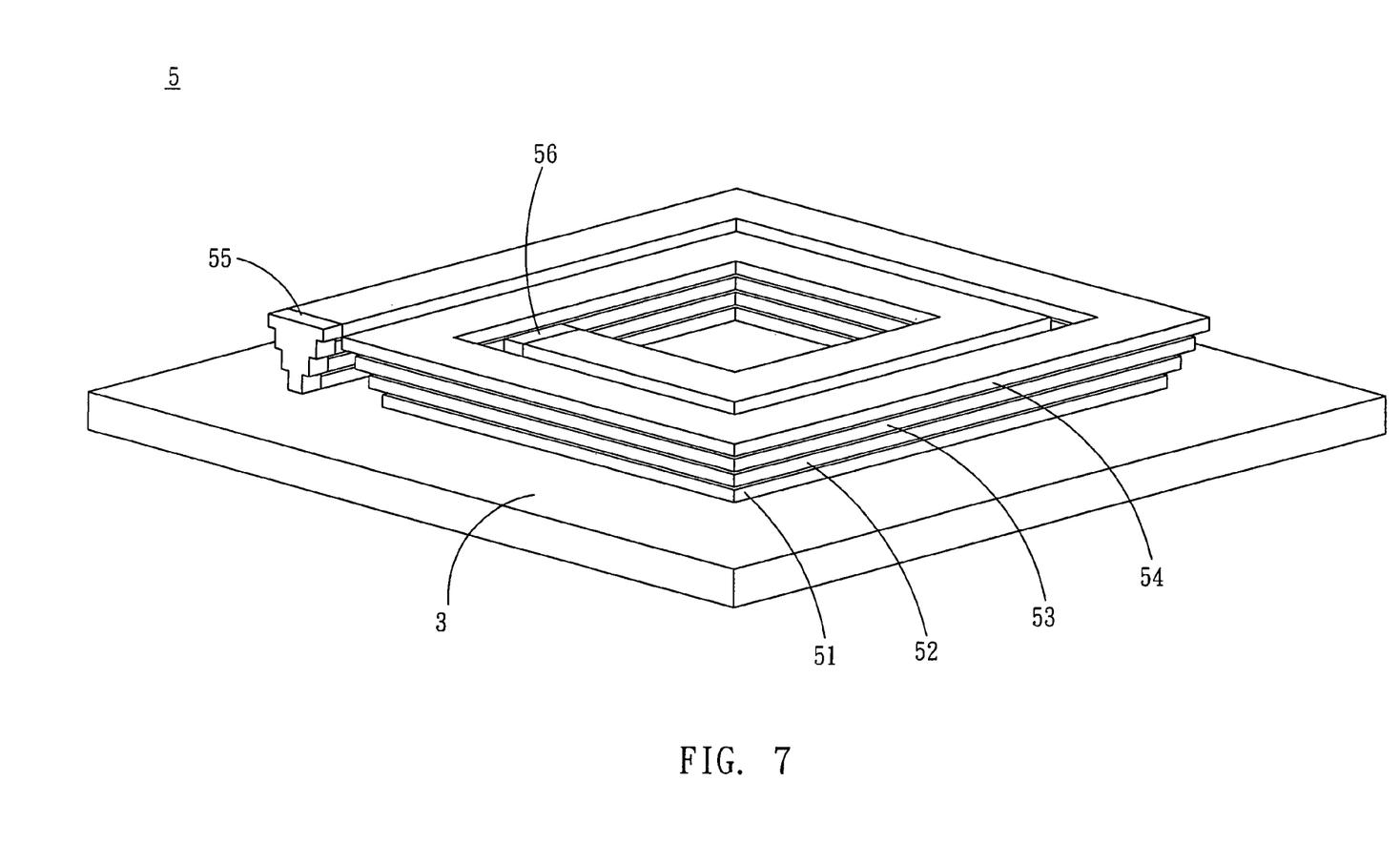
FIG. 7 is a three-dimensional view showing the substrate and the electrical conductive layers of a second embodiment of an inductor according to the present invention.
Figure 8:
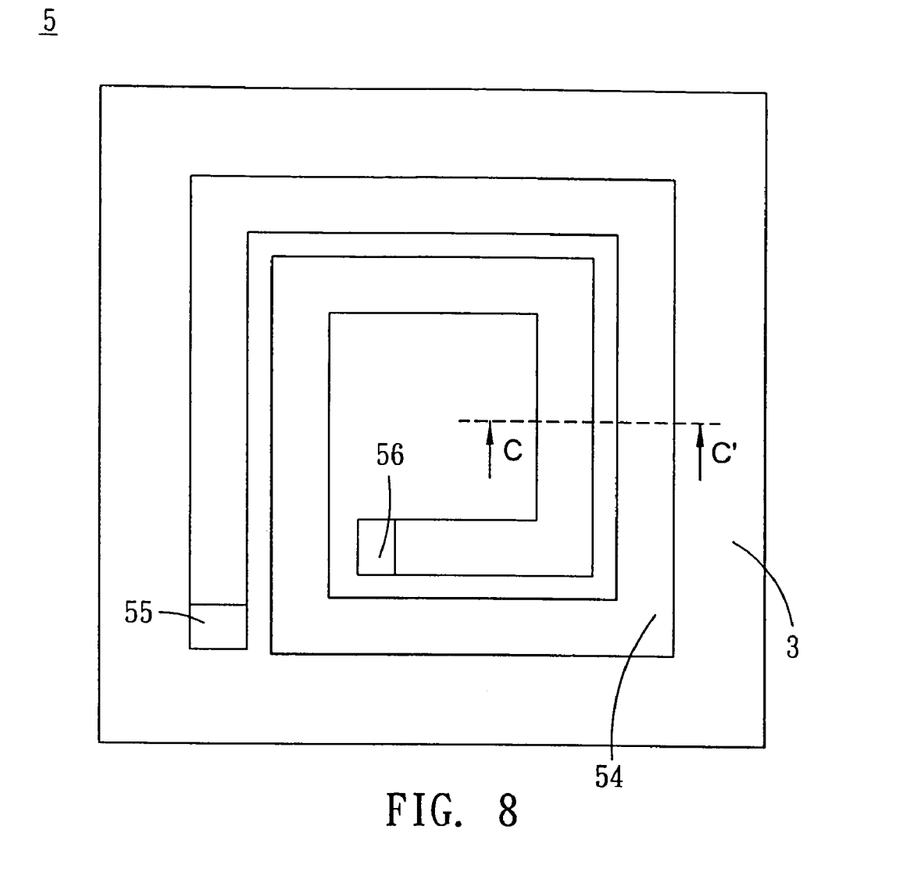
FIG. 8 is a top view showing the inductor in FIG. 7.
Figure 9:
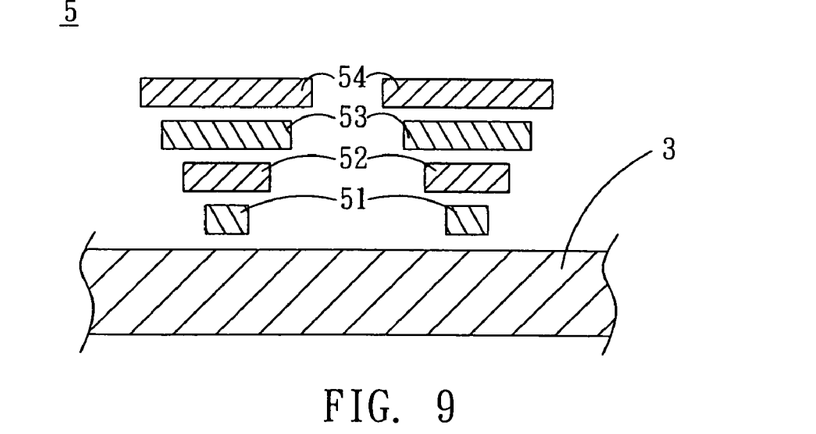
FIG. 9 is a cross-sectional view along C-C' line showing the inductor in FIG. 8.

As shown in FIGS. 7 to 9, a second embodiment of an inductor 5 according to the present invention is disposed over a substrate 3 and includes a plurality of electrical conductive layers 51-54. The electrical conductive layers 51-54 respectively have at least one spiral conductive loop, which has a first end 55 and a second end 56. The first ends 55 of the electrical conductive layers 51-54 are electrically connected with each other and the second ends 56 of the electrical conductive layers 51-54 are electrically connected with each other. The width or projecting area of each electrical conductive layer is less than the width or projecting area of the upper electrical conductive layer respectively. The interconnection of the first ends 55 or the second ends 56 may not limited as this embodiment. One who skilled in this art would modify the interconnections according to the requirements of various circuit designs.

Between the substrate 3 and the electrical conductive layers 51-54 are isolated by a dielectric material (not shown). The electrical connection between the electrical conductive layers 51-54 is achieved by a conductive wire, a conductive via or a contact.

The electrical conductive layers 51-54 are electrically connected with each other via the first end 55 and the second end 56 of the inductor 5. Two signal terminals (not shown) are respectively connected with the first end 55 and the second end 56. In this embodiment, the width or projecting area of the electrical conductive layer 51 is not larger than half of the width or projecting area of the electrical conductive layer 54 respectively.

Figure 10:
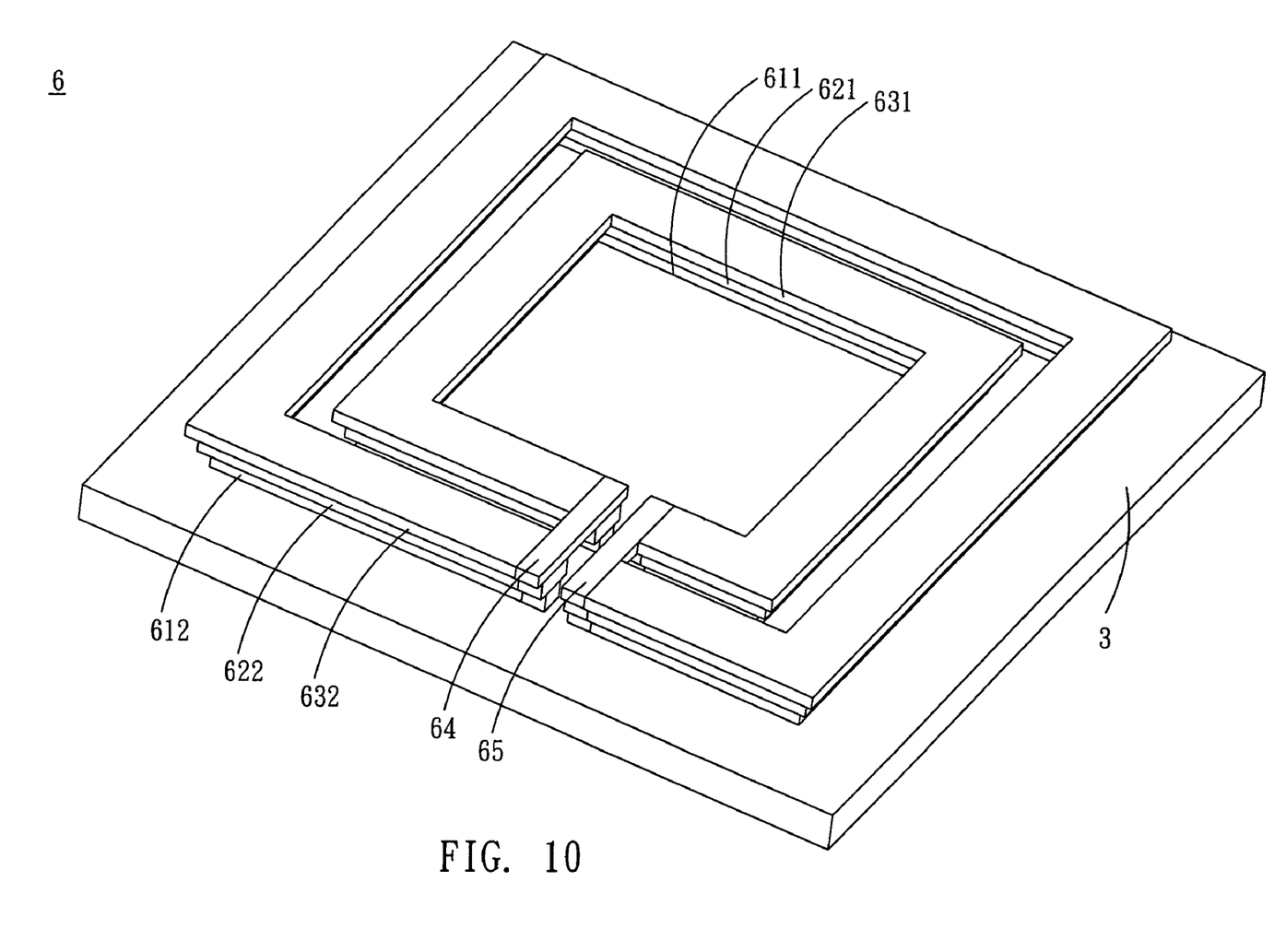
FIG. 10 is a three-dimensional view showing the substrate and the electrical conductive layers of a third embodiment of an inductor according to the present invention.
Figure 11:
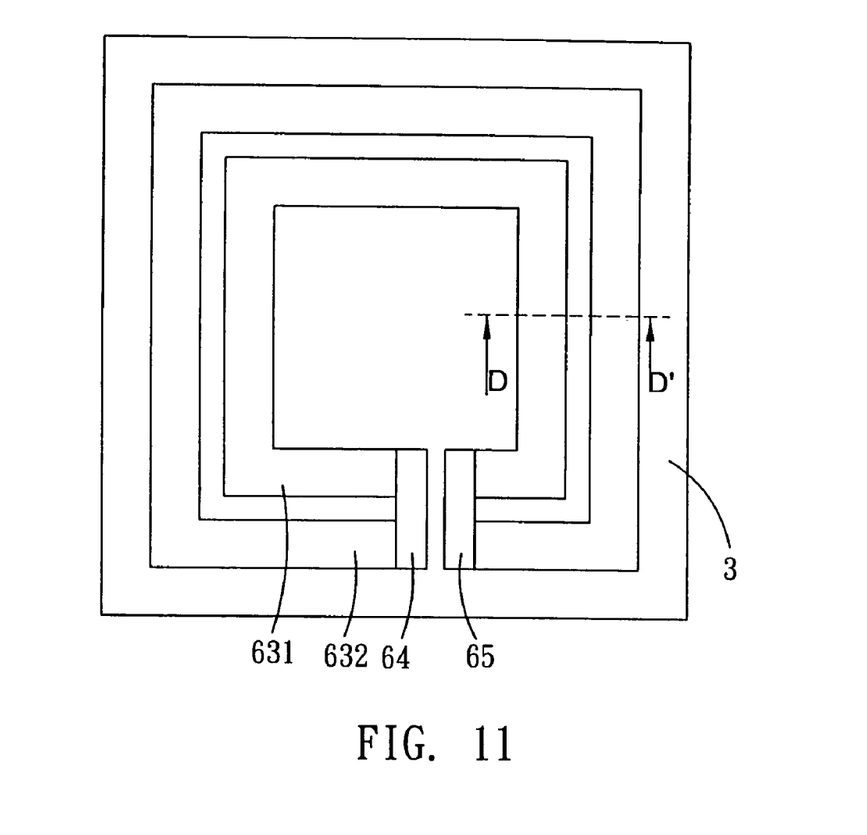
FIG. 11 is a top view showing the inductor in FIG. 10.
Figure 12:
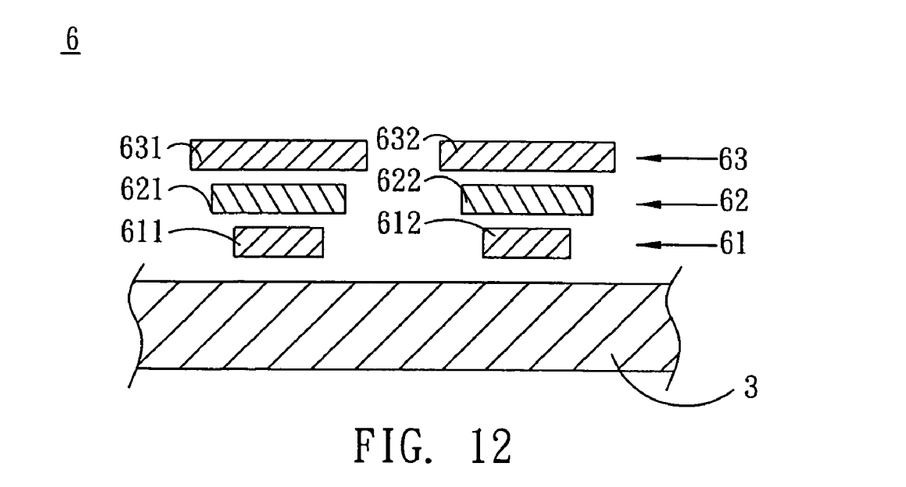
FIG. 12 is a cross-sectional view along D-D' line showing the inductor in FIG. 11.
Figure 13:
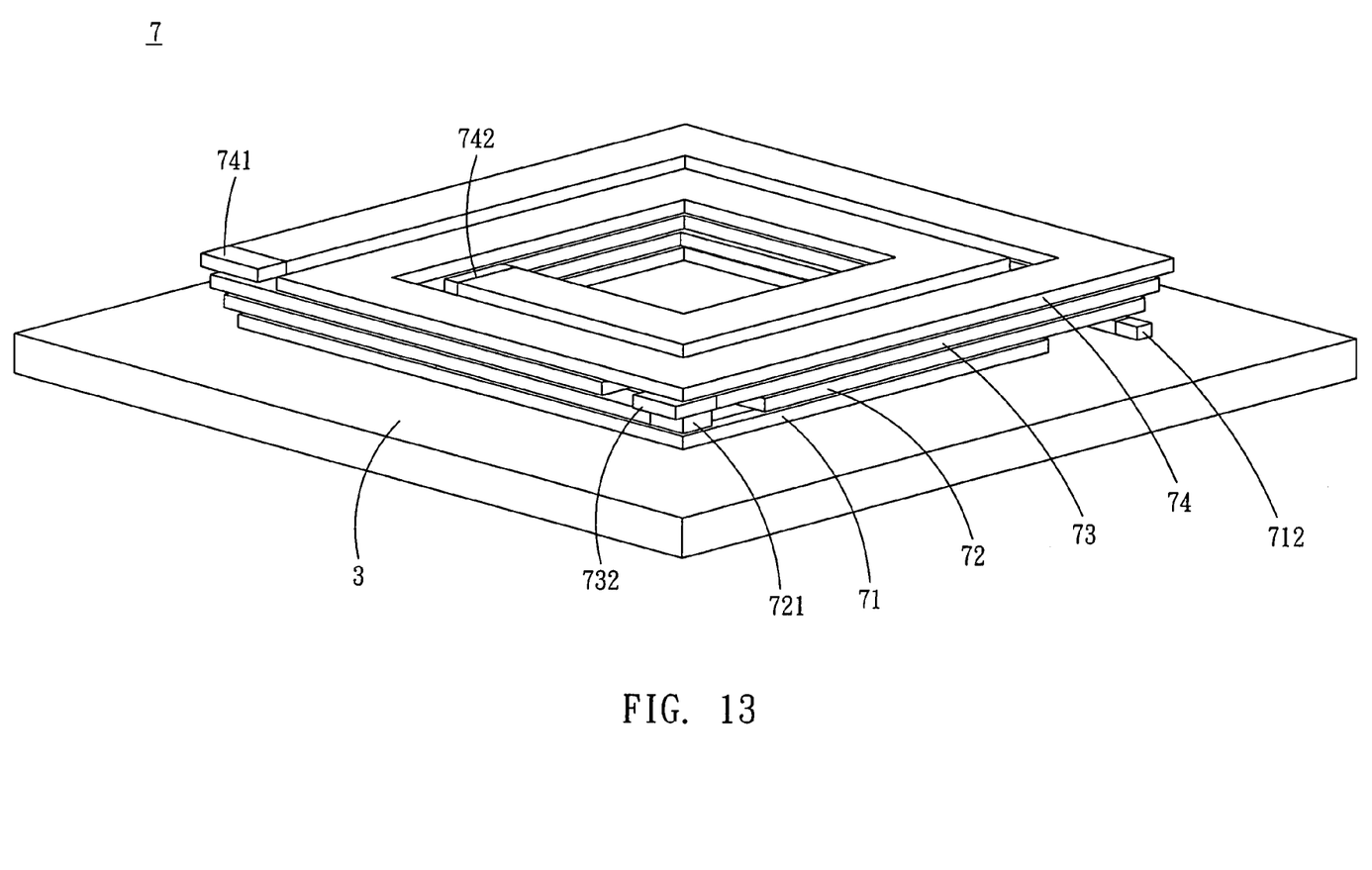
FIG. 13 is a three-dimensional view showing the substrate and the electrical conductive layers of a fourth embodiment of an inductor according to the present invention.
Figure 14:
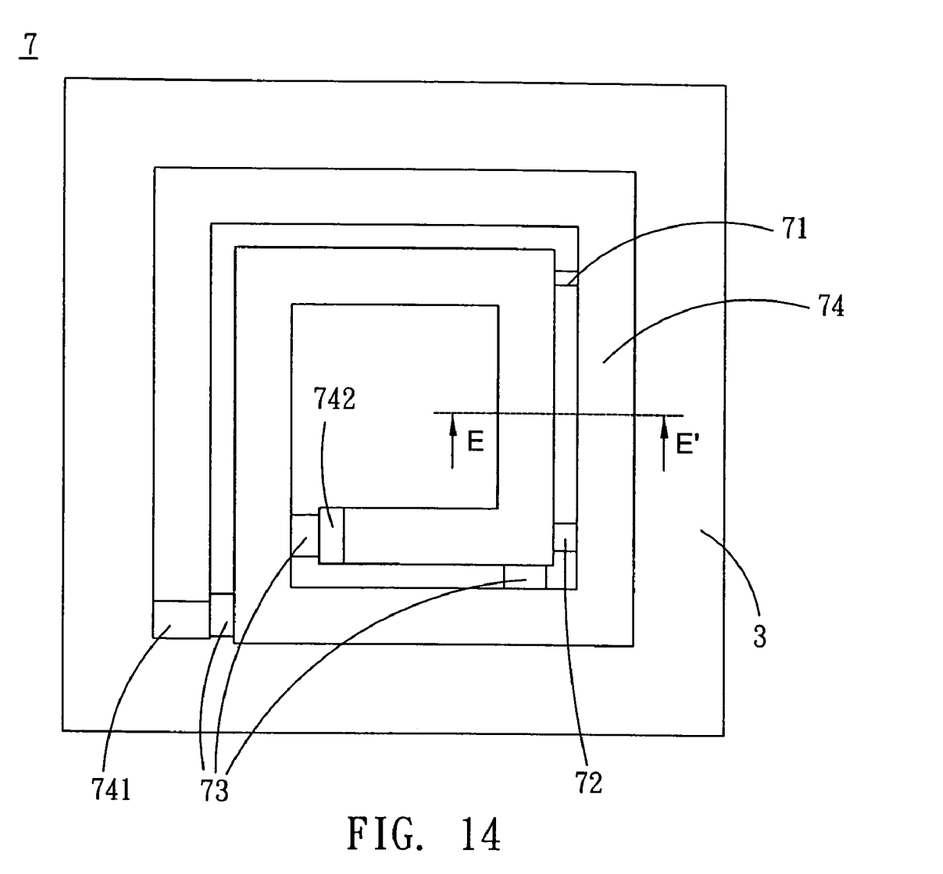
FIG. 14 is a top view showing the inductor in FIG. 13.
Figure 15:
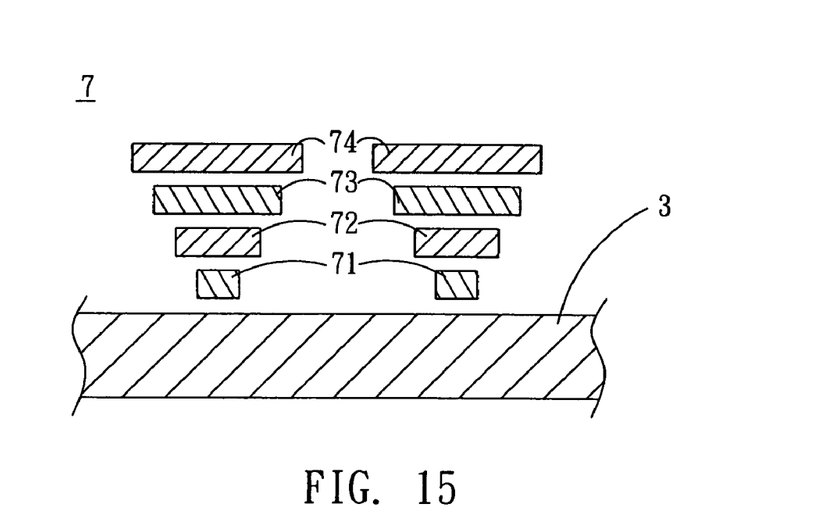
FIG. 15 is a cross-sectional view along E-E' line showing the inductor in FIG. 14.
Figure 16:
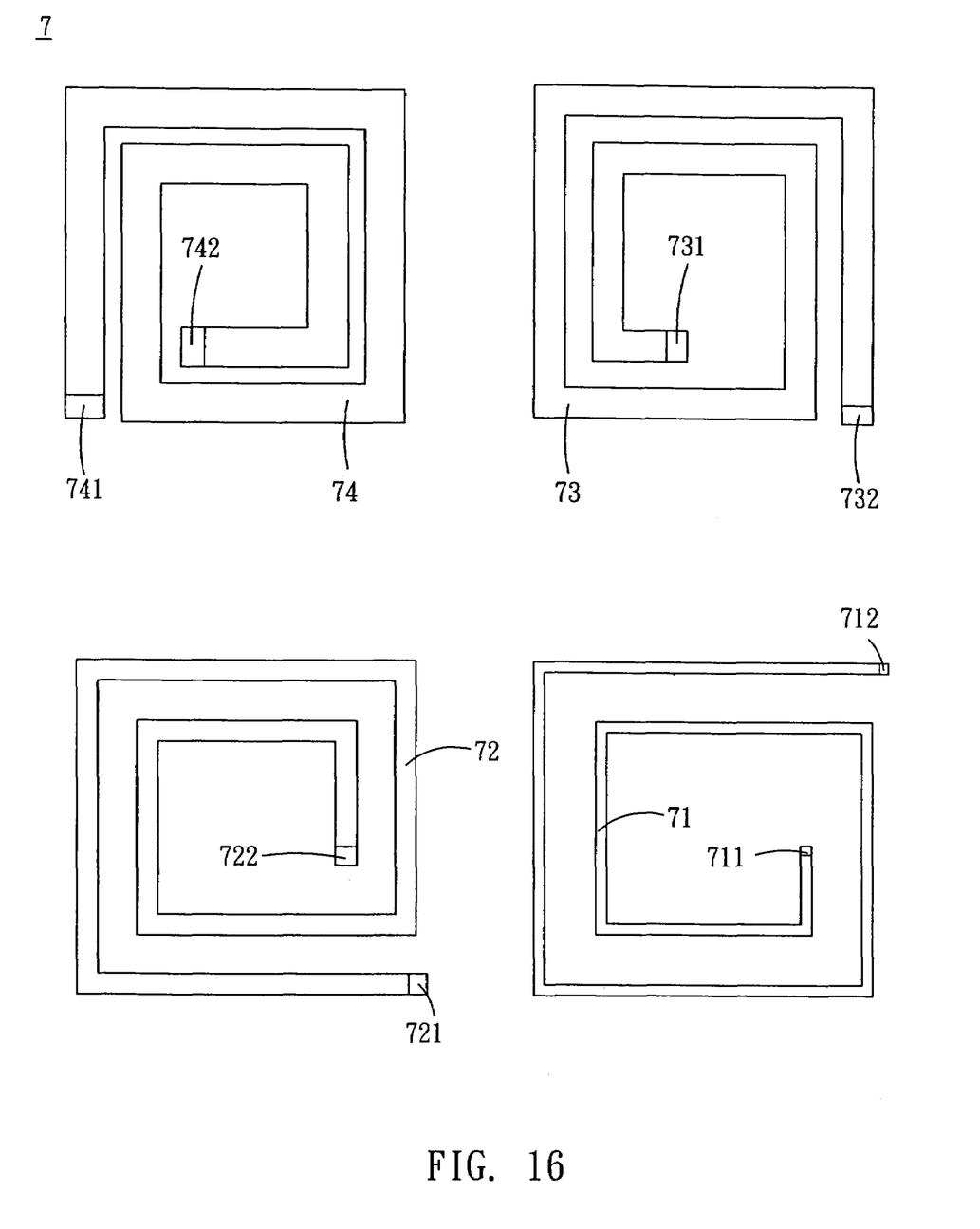
FIG. 16 is a top view respectively showing the electrical conductive layers of the inductor in FIG. 13.

As shown in FIGS. 10 to 12, a third embodiment of an inductor 6 according to the present invention is disposed over a substrate 3 and includes a plurality of electrical conductive layers 61-63. The electrical conductive layers 61-63 respectively have a plurality of conductive loops, which has a first end 64 and a second end 65. One first ends 64 of the conductive loops, which are formed on the electrical conductive layers 61-63 respectively, are electrically connected with each other and the second ends 65 of the conductive loops are electrically connected with each other. The width or projecting area of each electrical conductive layer is less than the width or projecting area of the upper electrical conductive layer respectively.

In this embodiment, the electrical conductive layer 63 has two conductive loops 631-632, the electrical conductive layer 62 has two conductive loops 621-622, and the electrical conductive layer 61 has two conductive loops 611-612. Two ends of the conductive loops 631-632, the conductive loops 621-622 and the conductive loops 611-612 are respectively electrically connected with the first end 64 and the second end 65 of the inductor 6. Two signal terminals (not shown) are respectively connected with the first end 64 and the second end 65.

The width or projecting area of the conductive loops 621-622 is less than the width or projecting area of the conductive loops 631-632 respectively. The width or projecting area of the conductive loops 611-612 is less than the width or projecting area of the conductive loops 621-622 respectively. Between the substrate 3 and the electrical conductive layers 61-63 are isolated by a dielectric material (not shown). The electrical connection between the electrical conductive layers 61-63 is achieved by a conductive wire, a conductive via or a contact.

As shown in FIGS. 13 to 16, a fourth embodiment of an inductor 7 according to the present invention is disposed over a substrate 3 and includes a plurality of electrical conductive layers 71-74. A first end 741 of the electrical conductive layer 74 is electrically connected with a signal terminal (not shown), a second end 742 of the electrical conductive layer 74 is electrically connected with a first end 731 of the electrical conductive layer 73, a second end 732 of the electrical conductive layer 73 is electrically connected with a first end 721 of the electrical conductive layer 72, a second end 722 of the electrical conductive layer 72 is electrically connected with a first end 711 of the electrical conductive layer 71, and a second end 712 of the electrical conductive layer 71 is electrically connected with another signal terminal (not shown). The width or projecting area of each electrical conductive layer is less than the width or projecting area of the upper electrical conductive layer respectively.

Between the substrate 3 and the electrical conductive layers 71-74 are isolated by a dielectric material (not shown). The electrical connection between the electrical conductive layers 71-74 is achieved by a conductive wire, a conductive via or a contact.

The inductor according to the present invention may be formed by CMOS processes or micro electromechanical system (MEMS) technology. When the inductor is formed by MEMS technology, the inductor is suspended cantilever beam from the substrate. The dielectric material is thus not necessary to be disposed between the substrate and the electrical conductive layers.

In summary, due to the width or projecting area of the first electrical conductive layer is less than the width or projecting area of the second electrical conductive layer respectively or the width or projecting area of each electrical conductive layer is less than the width or projecting area of the upper electrical conductive layer respectively, an inductor according to the present invention may reduce the influence of eddy current of the substrate and parasitic capacitance between the inductor and the substrate. The efficiency and quality of the inductor are thus improved.

Although the present invention has been described with reference to specific embodiments, this description is not meant to be construed in a pivoting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. An inductor formed over a substrate, comprising:
   a first electrical conductive layer over the substrate; and
   a second electrical conductive layer disposed over and electrically connected to the first electrical conductive layer;
   wherein the width or projecting area of the first electrical conductive layer is less than the width or projecting area of the second electrical conductive layer respectively.

2. The inductor according to claim 1, wherein the electrical connection is achieved by a conductive wire, a conductive via or a contact.

3. The inductor according to claim 1, wherein the first electrical conductive layer is adjacent to the second electrical conducive layer, and the width or projecting area of the first electrical conductive layer is not larger than eighty percent of the width or projecting area of the second electrical conductive layer.

4. The inductor according to claim 1, further comprising:
   at least one conductor disposed between the first electrical conductive layer and the second electrical conductive layer to electrically connect the first electrical conductive layer with the second electrical conductive layer.

5. The inductor according to claim 1, wherein the first electrical conductive layer has at least one spiral first conductive loop, which has a first end and a second end, and the second electrical conductive layer has at least one spiral second conductive loop, which has a third end and a fourth end.

6. The inductor according to claim 5, wherein the first end is electrically connected with the fourth end or the second end is electrically connected with the third end.

7. The inductor according to claim 5, wherein the first end is electrically connected with the third end and the second end is electrically connected with the fourth end.

8. The inductor according to claim 1, wherein the first electrical conductive layer has a plurality of first conductive loops, which respectively have a first end and a second end, and the second electrical conductive layer has a plurality of second conductive loops, which respectively have a third end and a fourth end.

9. The inductor according to claim 8, wherein the first ends are electrically connected with each other, the second ends are electrically connected with each other; the third ends are electrically connected with each other, and the fourth ends are electrically connected with each other.

10. The inductor according to claim 8, wherein the first ends are electrically connected with the third ends and the second ends are electrically connected with the fourth ends.

11. An inductor formed over a substrate, comprising:
    a plurality of electrical conductive layers sequentially disposed over the substrate and electrically connected with each other;
    wherein the width or projecting area of each lower electrical conductive layer is less than the width or projecting area of the upper electrical conductive layer respectively.

12. The inductor according to claim 11, wherein the width or projecting area of one of the electrical conductive layers is not larger than half of the width or projecting area of any upper electrical conductive layers.

13. The inductor according to claim 11, wherein the electrical conductive layers comprises a first electrical conducive layer and a second electrical conducive layer be adjacent to and formed over the first electrical conductive layer, and the width or projecting area of the first electrical conductive layers is not larger than eighty percent of the width or projecting area of the second electrical conductive layer.

14. The inductor according to claim 11, further comprising:
    at least one conductor disposed between the adjacent electrical conductive layers to electrically connect the adjacent electrical conductive layers.

15. The inductor according to claim 11, wherein the electrical conductive layers respectively have at least one spiral conductive loop, which has a first end and a second end.

16. The inductor according to claim 15, wherein each first end is electrically connected with the upper second end, or each second end is electrically connected with the upper first end.

17. The inductor according to claim 15, wherein each first end is electrically connected with the upper first end and each second end is electrically connected with the upper second end.

18. The inductor according to claim 11, wherein the electrical conductive layers respectively have a plurality of conductive loops, which respectively have a first end and a second end.

19. The inductor according to claim 18, wherein the first ends are electrically connected with each other and the second ends are electrically connected with each other.

20. The inductor according to claim 18, wherein each first ends are electrically connected with the upper first ends and each second ends are electrically connected with the upper second ends.

* * * * *